(12) United States Patent
Tsukida et al.

(10) Patent No.: US 8,879,234 B2
(45) Date of Patent: Nov. 4, 2014

(54) LAMINATED CERAMIC ELECTRONIC COMPONENT

(75) Inventors: Masaki Tsukida, Nagaokakyo (JP); Atsushi Ishida, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 6 days.

(21) Appl. No.: 13/550,630

(22) Filed: Jul. 17, 2012

(65) Prior Publication Data

US 2013/0020914 A1 Jan. 24, 2013

(30) Foreign Application Priority Data

Jul. 19, 2011 (JP) ................................. 2011-157875

(51) Int. Cl.

| | | |
|---|---|---|
| H01G 4/00 | (2006.01) | |
| H01G 4/30 | (2006.01) | |
| H01G 4/012 | (2006.01) | |
| H01C 7/13 | (2006.01) | |
| H01G 4/232 | (2006.01) | |
| H01C 7/18 | (2006.01) | |
| H01C 1/148 | (2006.01) | |
| H01L 41/047 | (2006.01) | |
| H01F 27/29 | (2006.01) | |
| H01F 17/00 | (2006.01) | |

(52) U.S. Cl.
CPC .............. *H01C 7/13* (2013.01); *H01L 41/0471* (2013.01); *H01F 27/292* (2013.01); *H01G 4/012* (2013.01); *H01G 4/232* (2013.01); *H01C 7/18* (2013.01); *H01F 17/0013* (2013.01); *H01G 4/30* (2013.01); *H01C 1/148* (2013.01)
USPC ...................................... 361/301.4; 361/301.3

(58) Field of Classification Search
USPC ........................................... 361/301.3, 301.4
See application file for complete search history.

(56) References Cited

U.S. PATENT DOCUMENTS

2006/0285271 A1  12/2006  Lee et al.
2008/0158773 A1   7/2008  Lee et al.

FOREIGN PATENT DOCUMENTS

| EP | 0246134 | * | 4/1987 | ............... H01G 4/34 |
| JP | 1999-340106 | * | 12/1999 | ............. H01G 13/00 |
| JP | 2000-195754 A | | 7/2000 | |
| JP | 2000-294452 A | | 10/2000 | |
| JP | 2003-151850 A | | 5/2003 | |
| JP | 2003-224216 A | | 8/2003 | |
| JP | 2003-257785 A | | 9/2003 | |

(Continued)

OTHER PUBLICATIONS

Official Communication issued in corresponding Japanese Patent Application No. 2011-157875, mailed on Jul. 23, 2013.

*Primary Examiner* — Dion R Ferguson
(74) *Attorney, Agent, or Firm* — Keating & Bennett, LLP

(57) ABSTRACT

In a laminated ceramic electronic component, a first functional portion and a second functional portion are disposed within a ceramic element body so as to be adjacent to each other along a height direction, first and second internal electrodes face each other through a ceramic layer in the first functional portion, and third and fourth internal electrodes whose number of laminated layers is different from the number of laminated layers of the first and second internal electrodes face each other through the ceramic layer in the second functional portion. A marking internal conductor is disposed on the same plane as the first internal electrode and/or the second internal electrode, a marking external conductor is disposed on the side surface of the ceramic element body so as to link a plurality of exposed marking internal conductors such that it is possible to recognize vertical directionality.

2 Claims, 23 Drawing Sheets

(56) References Cited

FOREIGN PATENT DOCUMENTS

| | | | |
|---|---|---|---|
| JP | 2006-108383 A | 4/2006 | |
| JP | 2006-203258 A | 8/2006 | |
| JP | 2006-352141 A | 12/2006 | |
| JP | 2009-071106 * | 4/2009 | ............ H01G 4/12 |
| JP | 2010-165975 A | 7/2010 | |

* cited by examiner

LAMINATED CERAMIC ELECTRONIC COMPONENT

BACKGROUND OF THE INVENTION

1. Field of the Invention

The present invention relates to a laminated ceramic electronic component, and in particular, a laminated ceramic electronic component in which a plurality of functional portions are included within one component main body in a manner similar to an array-type laminated ceramic electronic component.

2. Description of the Related Art

In recent years, as miniaturization of electronic devices including a mobile phone and a portable audio player has been advanced, miniaturization of mounting substrates to be mounted in electronic devices has been advanced.

In addition, along with the miniaturization of the mounting substrates, mounting areas in the mounting substrates have also become small. Therefore, a request for downsizing an electronic component to be mounted in the mounting substrate has become strong, and an array-type electronic component has been frequently used where a plurality of electronic component elements are integrated into a single chip.

Using the array-type electronic component, it is possible to reduce not only a mounting space but also a mounting cost, compared with a case where a plurality of electronic components are mounted.

As a representative example of the array-type electronic component, in particular, a laminated ceramic electronic component, a capacitor array may be cited. In a usual capacitor array, for example, four external electrodes are formed in one side surface, and four capacitors are extracted between the external electrodes facing each other.

Usually, a plurality of capacitors extracted from a capacitor array are often equal to one another. However, for convenience of circuit design, in some case, it is also desired that these capacitors are different from one another. In response to this, in Japanese Unexamined Patent Application Publication No. 2003-257785, it has been proposed that, by causing the areas of internal electrodes configuring individual capacitor portions to be different from one another, capacitors that are different from one another are extracted.

However, since, in a structure described in Japanese Unexamined Patent Application Publication No. 2003-257785, internal electrodes whose number corresponds to the number of capacitors to be extracted are disposed on a common ceramic layer, the structure has a limitation in increasing the area of one internal electrode.

SUMMARY OF THE INVENTION

Preferred embodiments of the present invention provide a laminated ceramic electronic component capable of solving the above-mentioned problems.

According to a preferred embodiment of the present invention, a laminated ceramic electronic component includes a ceramic element body including a plurality of laminated ceramic layers, a pair of main surfaces facing each other, and a side surface connecting the main surfaces, first to fourth internal electrodes disposed within the ceramic element body, and first to fourth external electrodes disposed on the side surface of the ceramic element body and electrically connected to the first to fourth internal electrodes, respectively, and the laminated ceramic electronic component preferably has the following features.

A first functional portion and a second functional portion are disposed within the ceramic element body so as to be adjacent to each other along a height direction in which the main surfaces are connected, the first and second internal electrodes face each other in the height direction through the ceramic layer, in the first functional portion, and the third and fourth internal electrodes face each other in the height direction through the ceramic layer, in the second functional portion.

In addition, the total number of laminated layers of the first and second internal electrodes in the first functional portion is preferably different from the total number of laminated layers of the third and fourth internal electrodes in the second functional portion.

In addition, the laminated ceramic electronic component according to a preferred embodiment of the present invention preferably further includes a first marking internal conductor disposed on the same plane as at least one of the first and second internal electrodes and exposed at the side surface, and a first marking external conductor disposed on the side surface so as to link a plurality of the exposed first marking internal conductors.

According to the laminated ceramic electronic component according to a preferred embodiment of the present invention, since a plurality of functional portions are disposed along the height direction, it is possible to reduce the number of internal electrodes to be disposed on a common ceramic layer and increase the area of each internal electrode, in each functional portion.

In addition, in the laminated ceramic electronic component according to a preferred embodiment of the present invention, it is possible to cause the characteristic of each functional portion to vary, depending on a variation in the total number of laminated layers of internal electrodes. In this way, while, in the laminated ceramic electronic component, vertical directionality occurs when there is a difference between the individual functional portions, it is possible to discriminate this directionality by recognizing at least the first marking external conductor.

It is preferable that the laminated ceramic electronic component according to a preferred embodiment of the present invention further includes a second marking internal conductor disposed on the same plane as at least one of the third and fourth internal electrodes and exposed at the side surface, and a second marking external conductor disposed on the side surface so as to link a plurality of the exposed second marking internal conductors, wherein the total number of laminated layers of the first and second internal electrodes in the first functional portion is larger than the total number of laminated layers of the third and fourth internal electrodes in the second functional portion, and the dimension of the first marking external conductor along the height direction is greater than the dimension of the second marking external conductor along the height direction.

When the laminated ceramic electronic component according to a preferred embodiment of the present invention further includes the second marking external conductor and the dimension of the first marking external conductor along the height direction is caused to be greater than the dimension of the second marking external conductor along the height direction, it is possible to reliably and easily discriminate the above-mentioned directionality.

In addition, while, as described above, including the first and second functional portions, the laminated ceramic electronic component according to a preferred embodiment of the present invention may also further include at least one functional portion other than the first and second functional portions. In addition, while the first and second internal electrodes and the first and second external electrodes define the first functional portion, at least one internal electrode other than the first and second internal electrodes may also be further included in the first functional portion or at least one external electrode other than the first and second external electrodes may also be further included in the first functional portion. In the same way, while the third and fourth internal electrodes and the third and fourth external electrodes define the second functional portion, at least one internal electrode other than the third and fourth internal electrodes may also be further included in the second functional portion or at least one external electrode other than the third and fourth external electrodes may also be further included in the second functional portion.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
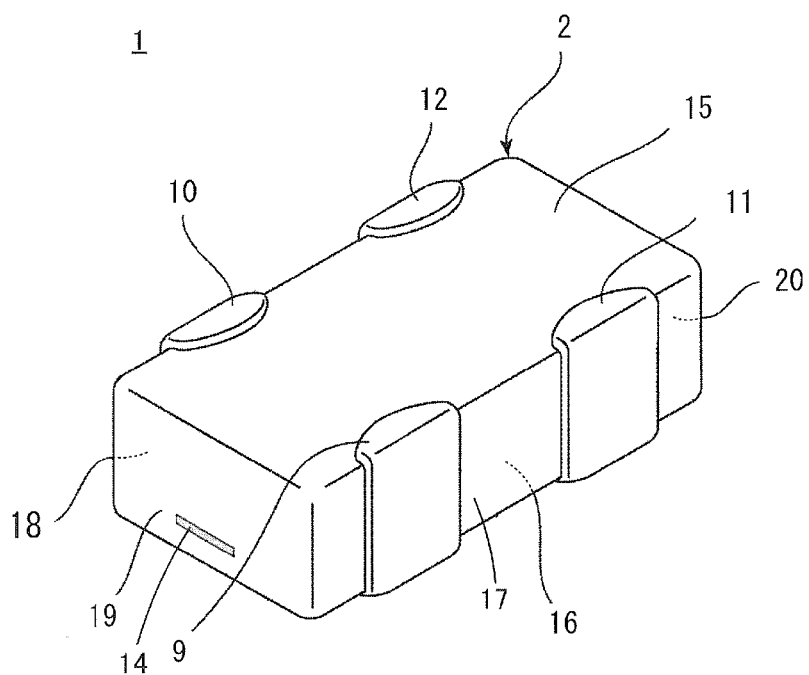
FIG. 1 is a perspective view illustrating an external appearance of a laminated ceramic capacitor serving as a laminated ceramic electronic component according to a first preferred embodiment of the present invention.
Figure 2:
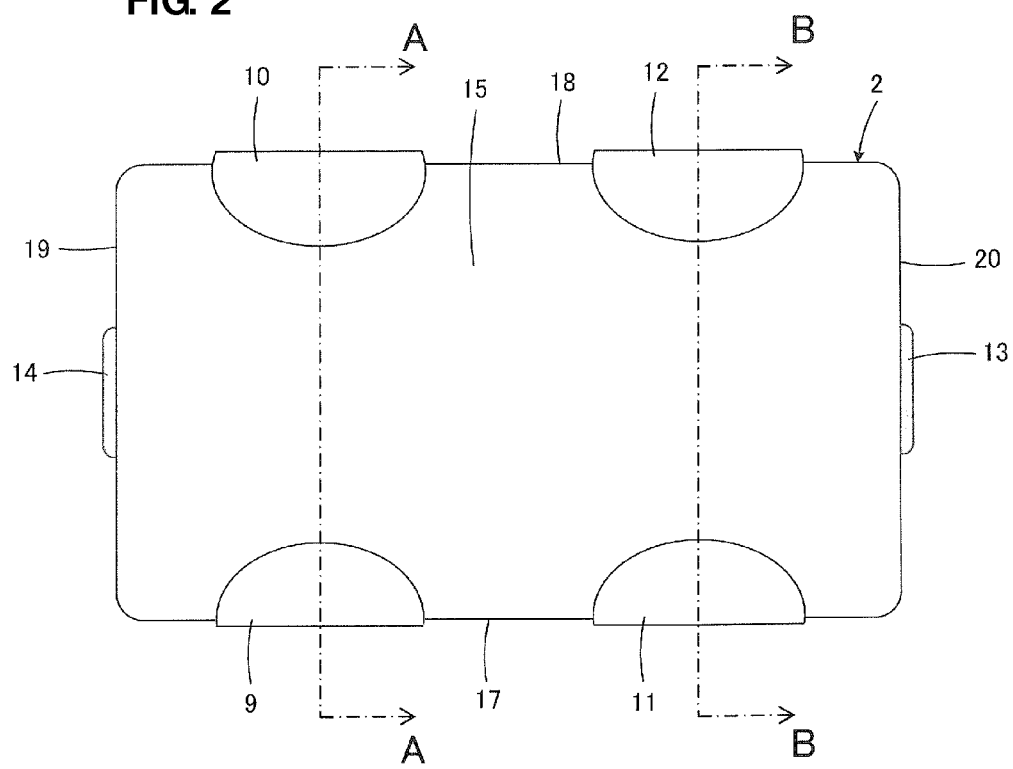
FIG. 2 is a top view of the laminated ceramic capacitor illustrated in FIG. 1.

Hereinafter, when preferred embodiments of the present invention are described, a laminated ceramic capacitor will be exemplified as a laminated ceramic electronic component.

First Preferred Embodiment

FIG. 1 to FIG. 11 are used for explaining a first preferred embodiment of the present invention. A laminated ceramic capacitor 1 according to the first preferred embodiment is an array-type capacitor in which two capacitor elements are integrated into a single chip.

The laminated ceramic capacitor 1 includes a ceramic element body 2, first, second, third, and fourth internal electrodes 3, 4, 5, and 6 and first and second marking internal conductors 7 and 8, individually disposed within the ceramic element body 2, and first, second, third, and fourth external electrodes 9, 10, 11, and 12 and first and second marking external conductors 13 and 14, disposed on the outer surface of the ceramic element body 2.

The ceramic element body 2 includes first and second main surfaces 15 and 16 facing each other, first and second side surfaces 17 and 18 facing each other, and third and fourth side surfaces 19 and 20 facing each other. The first to fourth side surfaces 17 to 20 connect the first and second main surfaces 15 and 16.

Here, a direction connecting the first and second main surfaces 15 and 16, a direction connecting the first and second side surfaces 17 and 18, and a direction connecting the third and fourth side surfaces 19 and 20 are defined as an H direction (height direction), a W direction (width direction), and an L direction (length direction), respectively.

It is preferable that the corner portion and the ridge portion of the ceramic element body 2 are rounded off.

Figure 5:
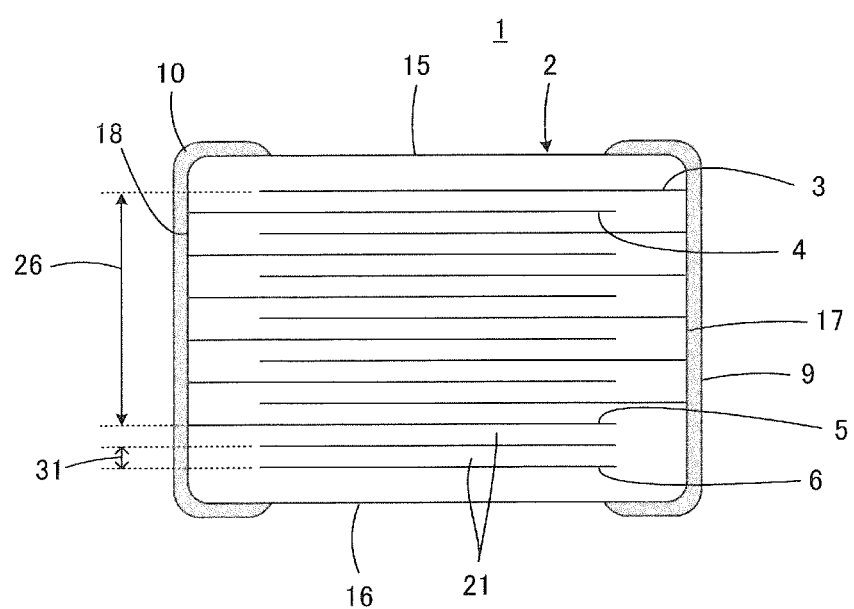
FIG. 5 is a cross-sectional view taken along a line A-A in FIG. 2.
Figure 6:
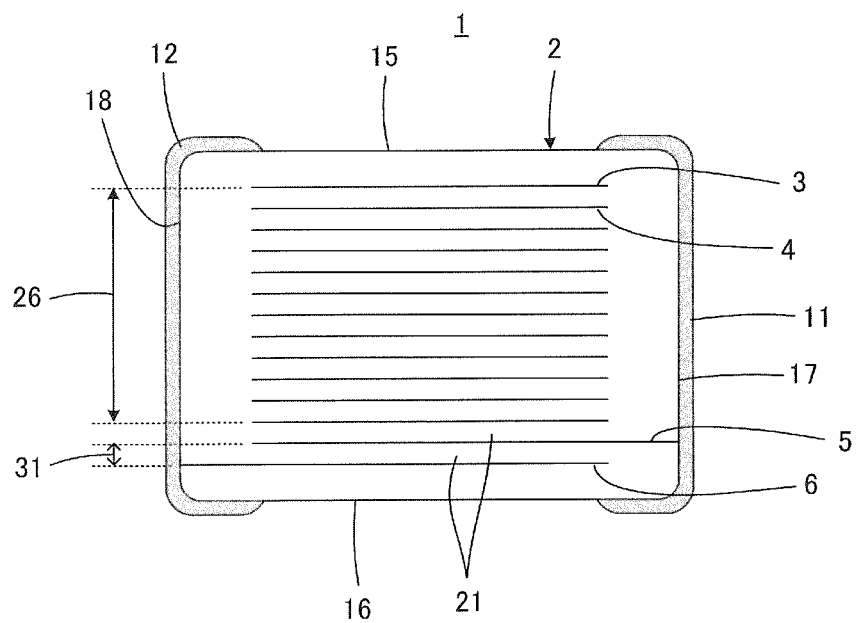
FIG. 6 is a cross-sectional view taken along a line B-B in FIG. 2.

As illustrated in FIG. 5 and FIG. 6, the ceramic element body 2 has a laminated structure including a plurality of ceramic layers 21 extending in the directions of the main surfaces 15 and 16 and laminated in the H direction. It is preferable that the thickness of each ceramic layer 21 is preferably about 0.5 μm to about 10 μm, for example.

As ceramics material forming the ceramic layer 21, a dielectric ceramic may preferably be used that mainly contains $BaTiO_3$, $CaTiO_3$, $SrTiO_3$, or $CaZrO_3$, for example. In addition, a dielectric ceramic may also be preferably used where an accessory component such as a Mn compound, an Mg compound, a Si compound, a Co compound, a Ni compound, a rare earth element compound, or other suitable material is added to one of these main components, for example.

Figure 7:
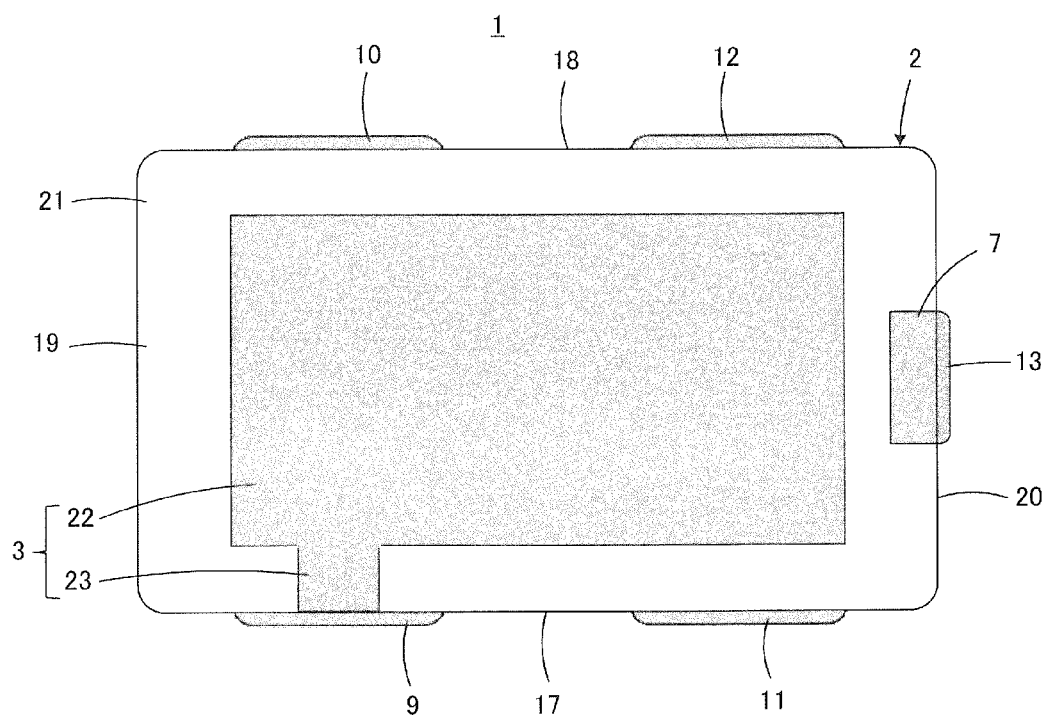
FIG. 7 is a cut portion end view taken along a plane parallel to main surfaces of a ceramic element body, in the laminated ceramic capacitor illustrated in FIG. 1, and illustrates a plane in which a first internal electrode extends.

As illustrated in FIG. 7, the first internal electrode 3 includes a first facing portion 22 and a first extraction portion 23 extracted from the first facing portion 22 and exposed at the first side surface 17. The first facing portion 22 occupies the main portion of a plane provided by the ceramic layer 21, and on the ceramic layer 21 on which the first facing portion 22 is disposed, the facing portion of another internal electrode is not disposed.

Figure 8:
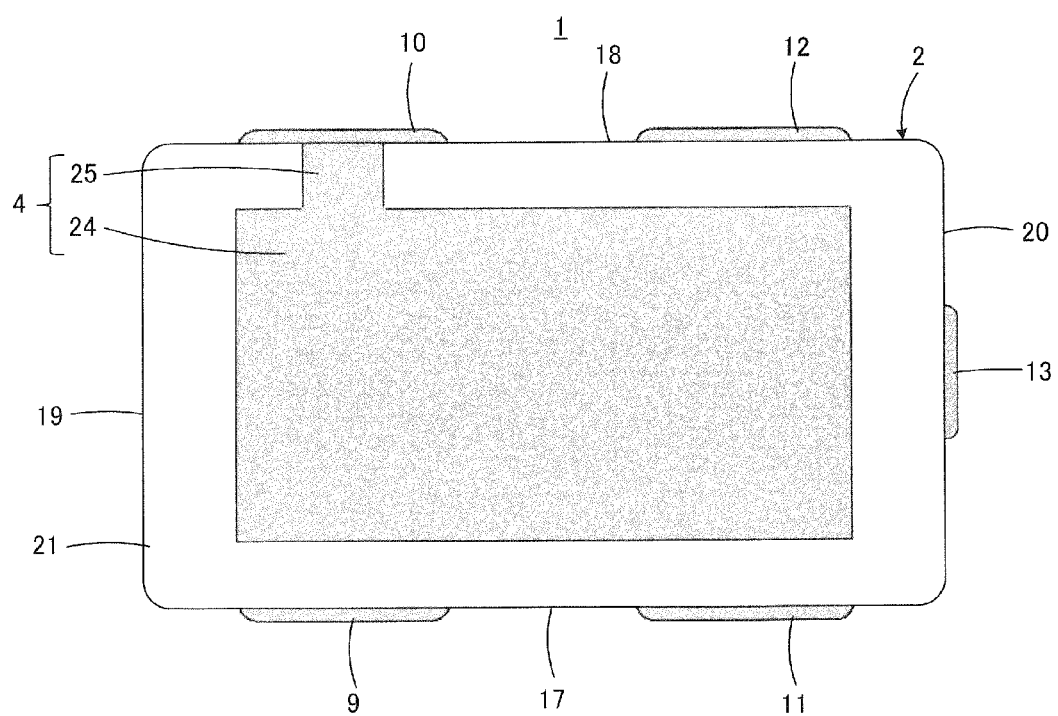
FIG. 8 is a cut portion end view taken along a plane parallel to the main surfaces of the ceramic element body, in the laminated ceramic capacitor illustrated in FIG. 1, and illustrates a plane in which a second internal electrode extends.

As illustrated in FIG. 8, the second internal electrode 4 includes a second facing portion 24 and a second extraction portion 25 extracted from the second facing portion 24 and exposed at the second side surface 18. The second facing portion 24 occupies the main portion of a plane provided by the ceramic layer 21, and on the ceramic layer 21 on which the second facing portion 24 is disposed, the facing portion of another internal electrode is not disposed.

As illustrated in FIG. 5 and FIG. 6, the first and second internal electrodes 3 and 4 face each other through the ceramic layer 21, more specifically, the first and second facing portions 22 and 24 face each other, and hence a first functional portion 26 is provided. The first functional portion 26 is located on one side in the H direction in the ceramic element body 2.

Figure 9:
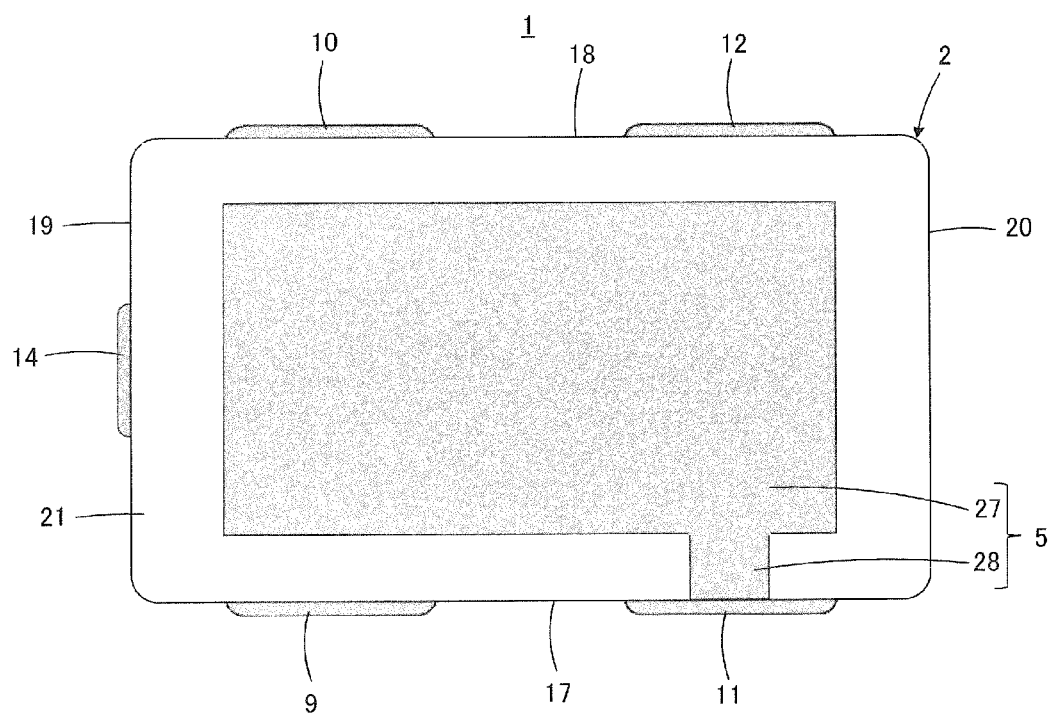
FIG. 9 is a cut portion end view taken along a plane parallel to the main surfaces of the ceramic element body, in the laminated ceramic capacitor illustrated in FIG. 1, and illustrates a plane in which a third internal electrode extends.

On the other hand, as illustrated in FIG. 9, the third internal electrode 5 includes a third facing portion and a third extraction portion 28 extracted from the third facing portion 27 and exposed at the first side surface 17. The third facing portion 27 occupies the main portion of a plane provided by the ceramic layer 21, and on the ceramic layer 21 on which the third facing portion 27 is disposed, the facing portion of another internal electrode is not disposed.

Figure 10:
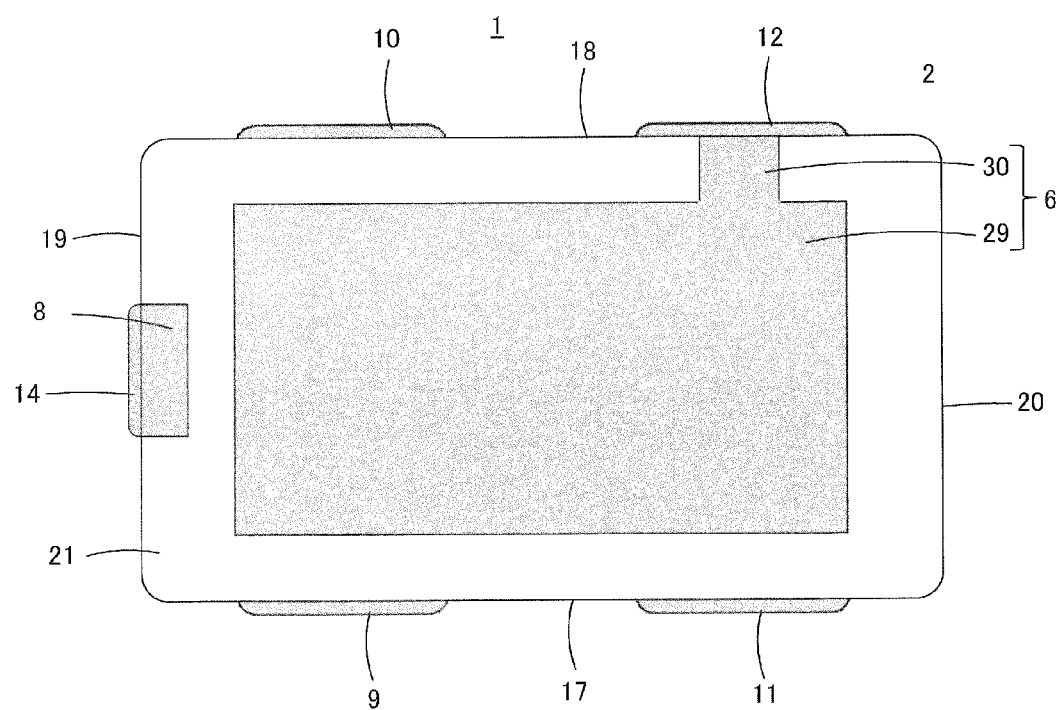
FIG. 10 is a cut portion end view taken along a plane parallel to the main surfaces of the ceramic element body, in the laminated ceramic capacitor illustrated in FIG. 1, and illustrates a plane in which a fourth internal electrode extends.

As illustrated in FIG. 10, the fourth internal electrode 6 includes a fourth facing portion 29 and a fourth extraction portion 30 extracted from the fourth facing portion 29 and exposed at the second side surface 18. The fourth facing portion 29 occupies the main portion of a plane provided by the ceramic layer 21, and on the ceramic layer 21 on which the fourth facing portion 29 is disposed, the facing portion of another internal electrode is not disposed.

As illustrated in FIG. 5 and FIG. 6, the third and fourth internal electrodes 5 and 6 face each other through the ceramic layer, more specifically, the third and fourth facing portions 27 and 29 face each other, and hence a second functional portion 31 is provided. The second functional portion 31 is adjacent to the first functional portion 26 in the H direction.

In each of the first and second functional portions 26 and 31, a predetermined electrical characteristic emerges. In the present preferred embodiment, in each of the first and second functional portions 26 and 31, capacitance is generated.

The total number of laminated layers of the first and second internal electrodes 3 and 4 in the first functional portion 26 is larger than the total number of laminated layers of the third and fourth internal electrodes 5 and 6 in the second functional portion 31. In the present preferred embodiment, compared with the second functional portion 31, the capacitance of the first functional portion 26 is large.

In addition, from the standpoint of avoiding crosstalk, while not illustrated, it is preferable that a buffering area only including a ceramic layer where no internal electrode is provided is disposed between the first functional portion 26 and the second functional portion 31.

As a conductive material for forming the internal electrodes 3 to 6, Ni, Cu, Ag, Pd, Ag—Pd alloy, or Au may be used, for example.

In addition, it is preferable that the thickness of each of the internal electrodes 3 to 6 is about 0.3 >m to about 2.0 μm, for example.

As illustrated in FIG. 7, the first marking internal conductor 7 is located on the same plane as the first internal electrode 3 and exposed at the fourth side surface 20, for example. The first marking internal conductor 7 may also be located on the same plane as the second internal electrode 4, and may also be located on the same plane as every one of the first and second internal electrodes 3 and 4, in the same way as in a preferred embodiment described later. In addition, the first marking internal conductor 7 may also be exposed at a side surface other than the fourth side surface 20.

As illustrated in FIG. 10, the second marking internal conductor 8 is located on the same plane as the fourth internal electrode 6 and exposed at the third side surface 19, for example. The second marking internal conductor 8 may also be located on the same plane as the third internal electrode 5, and may also be located on the same plane as every one of the third and fourth internal electrodes 5 and 6, in the same way as in a preferred embodiment described later. In addition, the second marking internal conductor 8 may also be exposed at a side surface other than the third side surface 19.

While it is preferable that the first marking internal conductor 7 is exposed so as to be distributed in a plurality of locations in the H direction in one of the side surfaces 17 to 20, it is not necessary for the first marking internal conductor 7 to be located on the same plane as every first internal electrode 3, every second internal electrode 4, or every one of the first and second internal electrodes 3 and 4.

In the same way, while it is also preferable that the second marking internal conductor 8 is exposed so as to be distributed in a plurality of locations in the H direction in one of the side surfaces 17 to 20, it is not necessary for the second marking internal conductor 8 to be located on the same plane as every third internal electrode 5, every fourth internal electrode 6, or every one of the third and fourth internal electrodes 5 and 6.

In addition, in the present preferred embodiment, as will be appreciated from FIG. 7 and FIG. 8, the first marking internal conductor 7 is disposed so as to be located away from the first and second extraction portions 23 and 25, and as will be appreciated from FIG. 9 and FIG. 10, the second marking internal conductor 8 is disposed so as to be located away from the third and fourth extraction portions 28 and 30. This technical meaning may be easily understood when referring to a printing pattern described later with reference to FIG. 11. The extraction portions 23 and 25 and the marking internal conductor 7 are located away from each other and the extraction portions 28 and 30, the marking internal conductor 8 are located away from each other, and hence, since a balance between the densities of both sides is established, the balance of a pressed state of a mother laminated body and delamination is prevented.

Incidentally, if a purpose of selecting directionality owing to the marking internal conductors 7 and 8 is emphasized, the extraction portion and the marking internal conductor may also be disposed so as to be located near each other.

The marking internal conductors 7 and 8 do not contribute to the emergence of the electrical characteristic of the laminated ceramic capacitor 1.

While the conditions of material and a thickness, capable of forming the marking internal conductors 7 and 8, are the same as the internal electrodes 3 to 6, it is preferable that the marking internal conductors 7 and 8 are formed using the same material as the internal electrodes 3 to 6 and the thicknesses thereof are the same as the internal electrodes 3 to 6.

FIG. 1, FIG. 2, FIG. 7, and FIG. 8 will be mainly referred to in the following description of external electrodes.

The first external electrode 9 is disposed on the first side surface 17, and electrically connected to the first extraction portion 23 of the first internal electrode 3. The second external electrode 10 is disposed on the second side surface 18, and electrically connected to the second extraction portion 25 of the second internal electrode 4. The third external electrode 11 is disposed on the first side surface 17, and electrically connected to the third extraction portion 28 of the third internal electrode 5. The fourth external electrode 12 is disposed on the second side surface 18, and electrically connected to the fourth extraction portion 30 of the fourth internal electrode 6.

While the four external electrodes 9 to 12 are preferably included in the present preferred embodiment, if the number of the functional portions increases to three, four, etc., the number of the external electrodes may increase to six, eight, etc., in response to the number of the functional portions, for example.

The external electrodes 9 to 12 include foundation layers connected to the extraction portions 23, 25, 28, and 30, respectively. The foundation layer may include a thick film including sintered metal and glass, a conductive resin film including filler metal and thermosetting resin, or a plated film including plating metal. The conductive resin film may be formed on the above-mentioned thick film.

It is preferable that each of the external electrodes 9 to 12 includes an upper layer covering the foundation layer, and the upper layer may be formed using the plated film.

When the foundation layer is formed using the thick film, as the sintered metal, for example, Cu, Ni, Ag, Pd, Ag—Pd alloy, Au, or other suitable material may be used. As the glass, for example, glass including an oxide of Si, B, or other suitable material may be used.

The thick film may also be a thick film fired simultaneously with the internal electrodes 3 to 6, and may also be a thick film obtained by applying and baking conductive paste on the sintered ceramic element body 2. It is preferable that the thickness of the thick film is about 10 μm to about 50 μm, for example.

When the foundation layer is formed using a resin electrode film, as the filler metal, for example, Ag, Pd, Ag—Pd alloy, or other suitable material may be used. As the thermosetting resin, for example, epoxy resin, phenol resin, or other suitable material may be used. It is preferable that the thickness of the conductive resin film is about 10 μm to about 50 μm, for example.

As the plated film forming each of the foundation layer and the upper layer, for example, one kind of metal selected from a group including Cu, Ni, Sn, Pb, Au, Ag, Pd, Bi, and Zn or alloy including the kind of metal may preferably be used, for example.

It is preferable that the thickness of the plated film forming each of the foundation layer and the upper layer is about 1 μm to about 15 μm, for example.

The plated film forming the upper layer may also be formed using a plurality of plated films. In this case, it is preferable that the first layer is Ni and the second layer is Sn, for example.

As illustrated in FIG. 2, FIG. 4, FIG. 7, and FIG. 8, the first marking external conductor 13 is disposed on the fourth side surface 20 and links a plurality of the exposed first marking internal conductors 7 to one another.

As illustrated in FIG. 1, FIG. 2, FIG. 3, FIG. 9, and FIG. 10, the second marking external conductor 14 is disposed on the third side surface 19 and links a plurality of the exposed second marking internal conductors 8 to one another.

It is preferable that these marking external conductors 13 and 14 are not connected to lands on a mounting substrate (not illustrated).

Figure 3:
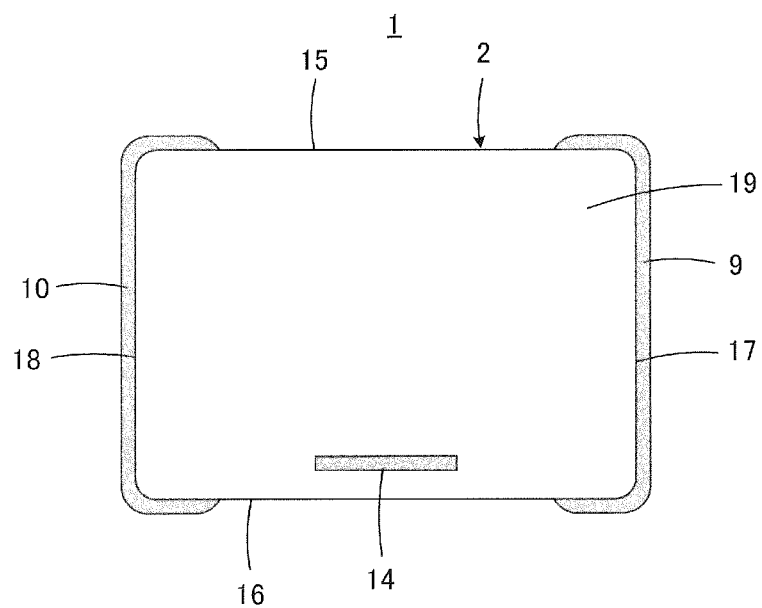
FIG. 3 is a right side view of the laminated ceramic capacitor illustrated in FIG. 1.
Figure 4:
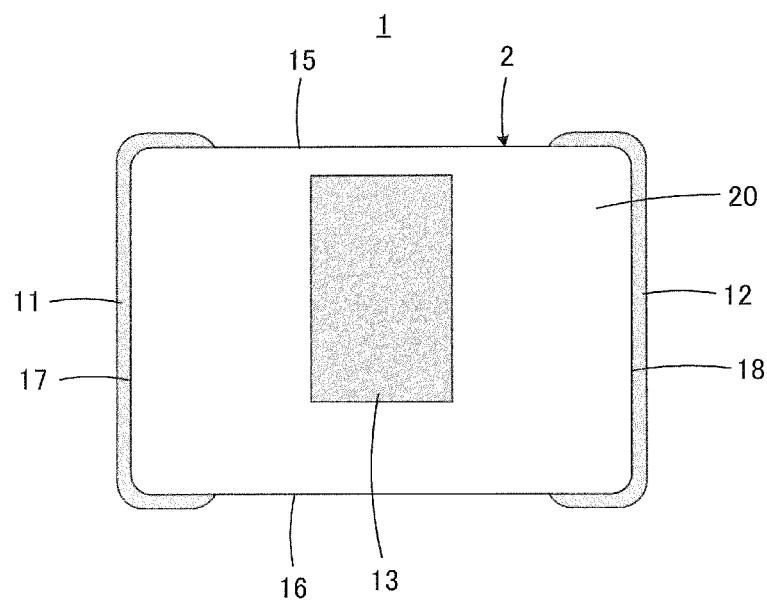
FIG. 4 is a left side view of the laminated ceramic capacitor illustrated in FIG. 1.

As will be appreciated from a comparison between FIG. 3 and FIG. 4, the dimension of the first marking external conductor 13 along the H direction is greater than the dimension of the second marking external conductor 14 along the H direction.

The marking external conductors 13 and 14 function as marks individually indicating the areas of the functional portions 26 and 31. By comparing the individual dimensions of the marking external conductors 13 and 14 with each other, it is possible to determine on which side a large capacitor portion or a small capacitor portion exists when being viewed in the H direction. Specifically, if, in a mounting device (not illustrated), the first and second marking external conductors 13 and 14 are imaged, the image of each thereof is processed, and a difference between the dimensions thereof is compared, it is possible to select the directionality of the H direction.

At the time of the mounting of the laminated ceramic capacitor 1, the mounting device is caused to preliminarily memorize which external electrode of the first to fourth external electrodes 9 to 12 corresponds to the large capacitor portion. In the case of the present preferred embodiment, the mounting device preferably is caused to memorize the effect that the first and second external electrodes 9 and 10, located away from the first marking external conductor 13, correspond to the input-output portion of the large capacitor portion.

In addition, the directionality of the laminated ceramic capacitor 1 is aligned on the basis of the marking external conductors 13 and 14, and hence it is possible to efficiently execute a post-process such as a measurement process in which the electrical characteristic of the laminated ceramic capacitor 1 is measured or a packaging process in which the laminated ceramic capacitor 1 is packaged using a substantially tape-shaped packaging body.

In addition, in such a way that the first marking internal conductor 7 and the first marking external conductor 13 are located on the third side surface 19 side and the second marking internal conductor 8 and the second marking external conductor 14 are located on the fourth side surface 20 side, it is possible to change the positions thereof.

It is preferable that the marking external conductors 13 and 14 are formed using the plated film. In this case, since plating grows with the exposed portion of each of the marking internal conductors 7 and 8 serving as the nucleus thereof, it is easy to reflect the exposure status of each of the marking internal conductors 7 and 8.

As a metal for forming the plated film, the same metal used in the external electrodes 9 to 12 may be used, for example. It is preferable that the marking external conductors 13 and 14 are formed using the same material as the foundation layers or the upper layers of the external electrodes 9 to 12.

For example, the laminated ceramic capacitor 1 is manufactured according to the following non-limiting example of a method for manufacturing the laminated ceramic capacitor 1.

A ceramic green sheet to be the ceramic layer 21 and various kinds of conductive paste are prepared. While the ceramic green sheet and the various kinds of conductive paste include binder and solvent, existing organic binder and existing organic solvent may be used.

The conductive paste is printed on the ceramic green sheet in a predetermined pattern, for example, using screen printing or other suitable process, and an internal electrode pattern and a marking internal conductor pattern are formed.

A predetermined number of external layer ceramic green sheets are laminated on which no internal electrode pattern and no marking internal conductor pattern are printed, an inner layer ceramic green sheet on which an internal electrode pattern and a marking internal conductor pattern are printed is laminated in a predetermined sequence, and thereon, a predetermined number of external layer ceramic green sheets are laminated again, thereby manufacturing the mother laminated body.

Figure 11:
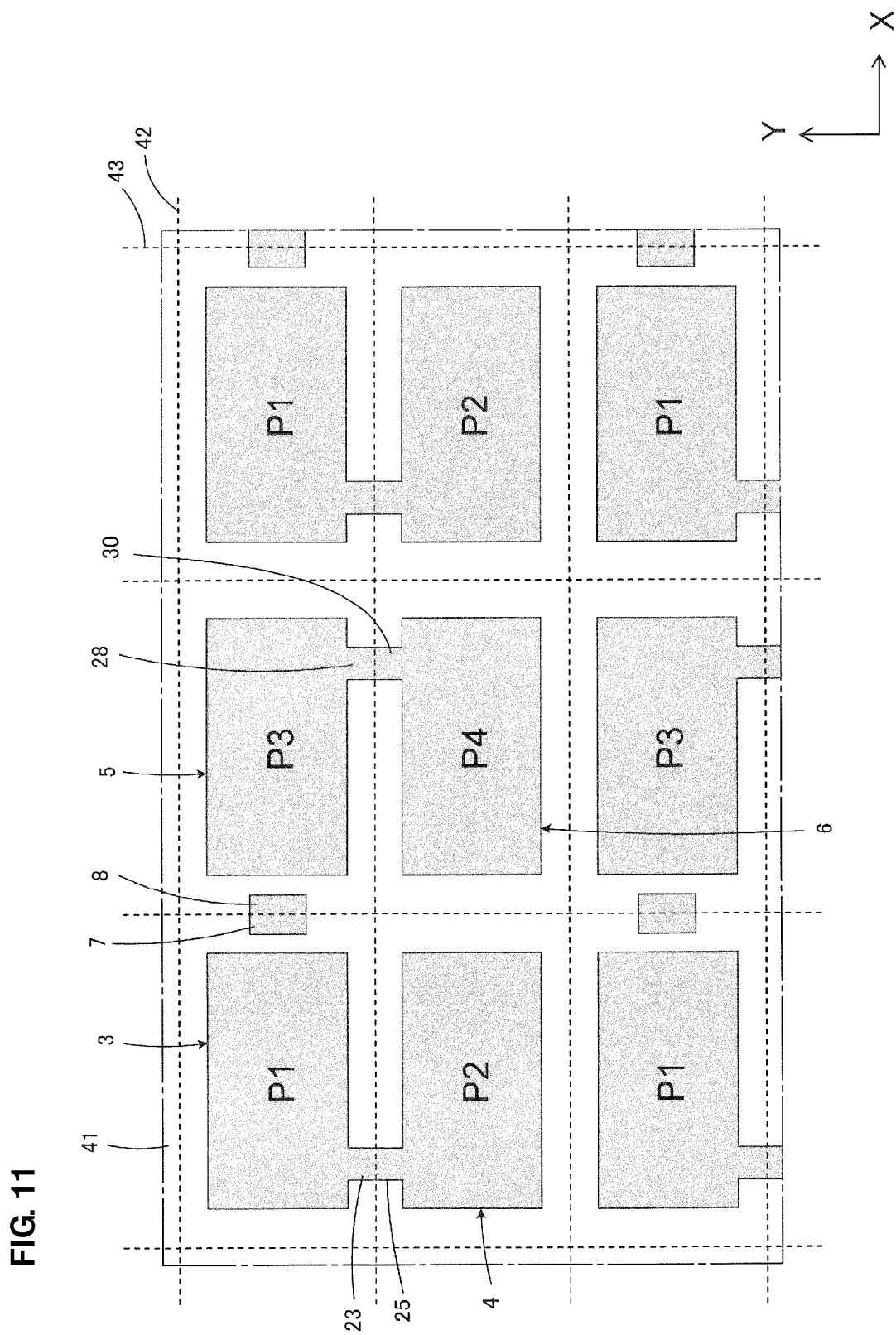
FIG. 11 is used for explaining a manufacturing method for the laminated ceramic capacitor illustrated in FIG. 1 and a diagram illustrating a printing pattern used for obtaining the internal electrodes and marking internal conductors.

Here, so as to describe a laminating method for the inner layer ceramic green sheet, an inner layer ceramic green sheet 41 on which various patterns are printed is illustrated in FIG. 11. It should be understood that a portion of the inner layer ceramic green sheet 41 is illustrated in FIG. 11. In FIG. 11, reference symbols used in FIG. 7 to FIG. 10 are assigned to portions corresponding to elements illustrated in FIG. 7 to FIG. 10.

In a printing pattern illustrated in FIG. 11, the first and second extraction portions 23 and 25 are linked to each other, the third and fourth extraction portions 28 and are linked to each other, and the first and second marking internal conductors 7 and 8 are linked to each other.

In FIG. 11, imaginary cut lines 42 and 43 are illustrated by dotted lines. An area surrounded by the imaginary cut lines 42 and 43 corresponds to an area providing the ceramic layer 21 corresponding to one laminated ceramic capacitor 1, and individual areas are substantially disposed in a matrix with a predetermined pitch.

A plurality of the inner layer ceramic green sheets 41 are prepared, and the second inner layer ceramic green sheet 41 is laminated on the first inner layer ceramic green sheet 41 with being displaced therefrom by one pitch in a Y direction. Accordingly, a pattern "P3" is laminated on a pattern "P4", and the above-described second functional portion 31 is formed.

Next, the third inner layer ceramic green sheet 41 is displaced by one pitch in an X direction, a pattern "P2" is laminated, and furthermore, the fourth inner layer ceramic green sheet 41 is displaced by one pitch in each of the X direction and the Y direction, a pattern "P1" is laminated. In this way, the pattern "P2" and the pattern "P1" are repeatedly laminated, and hence, the above-mentioned first functional portion 26 is formed.

While, here, paying attention to a central area from among nine areas illustrated in FIG. 11, the process of lamination is described, since the patterns "P1" and "P2" and the patterns "P3" and "P4" are in a mirror image relationship except for the marking internal conductors 7 and 8, the first and second functional portions 26 and 31 are also simultaneously formed in other areas.

In addition, if, between the patterns "P3" and "P4" and the patterns "P1" and "P2", a predetermined number of plain ceramic green sheets are laminated, it is possible to form the buffering area.

The mother laminated body is pressed in a lamination direction.

The mother laminated body is cut into predetermined sized pieces, and a raw ceramic element body is cut out.

The raw ceramic element body is fired. Accordingly, the illustrated ceramic element body 2 is obtained. Depending on the material of ceramic, an internal electrode, or the like, it is preferable that a firing temperature substantially ranges from about 900° C. to about 1300° C., for example.

After that, as necessary, barrel polishing is performed. Accordingly, the corner portion and ridge portion of the ceramic element body 2 are rounded off.

The foundation layers of the external electrodes 9 to 12 are formed.

In a case in which a foundation layer of an external electrode is formed using a thick film, conductive paste is applied to the side surfaces 17 and 18 of the ceramic element body 2 and baked thereonto. It is preferable that a baking temperature substantially ranges from about 700° C. to about 900° C., for example.

In a case in which a foundation layer of an external electrode is formed using a resin film, resin paste is applied to the side surfaces 17 and 18 of the ceramic element body 2 and thermally cured. It is preferable that a curing temperature substantially ranges from about 200° C. to about 300° C., for example.

In a case in which a foundation layer of an external electrode is formed using a plated film, the ceramic element body 2 is subjected to plating processing. Accordingly, the foundation layers of the external electrodes 9 to 12 and the marking external conductors 13 and 14 are simultaneously formed.

While any one of electrolytic plating and non-electrolytic plating may be adopted when the plating processing is performed, the non-electrolytic plating may have the disadvantage that preprocessing due to a catalyzer or the like is necessary so as to improve a plating deposition rate and the process is complicated. Accordingly, usually, it is preferable to adopt the electrolytic plating. It is also preferable that barrel plating is used as plating processing.

The foundation layer surfaces of the external electrodes 9 to 12 are subjected to the plating processing, and a plated film to be an upper layer is formed.

When the foundation layers of the external electrodes 9 to 12 have been formed using the thick film, the marking external conductors 13 and 14 are formed at this time.

In such a way as described above, the laminated ceramic capacitor 1 is completed.

Second Preferred Embodiment

Figure 12:
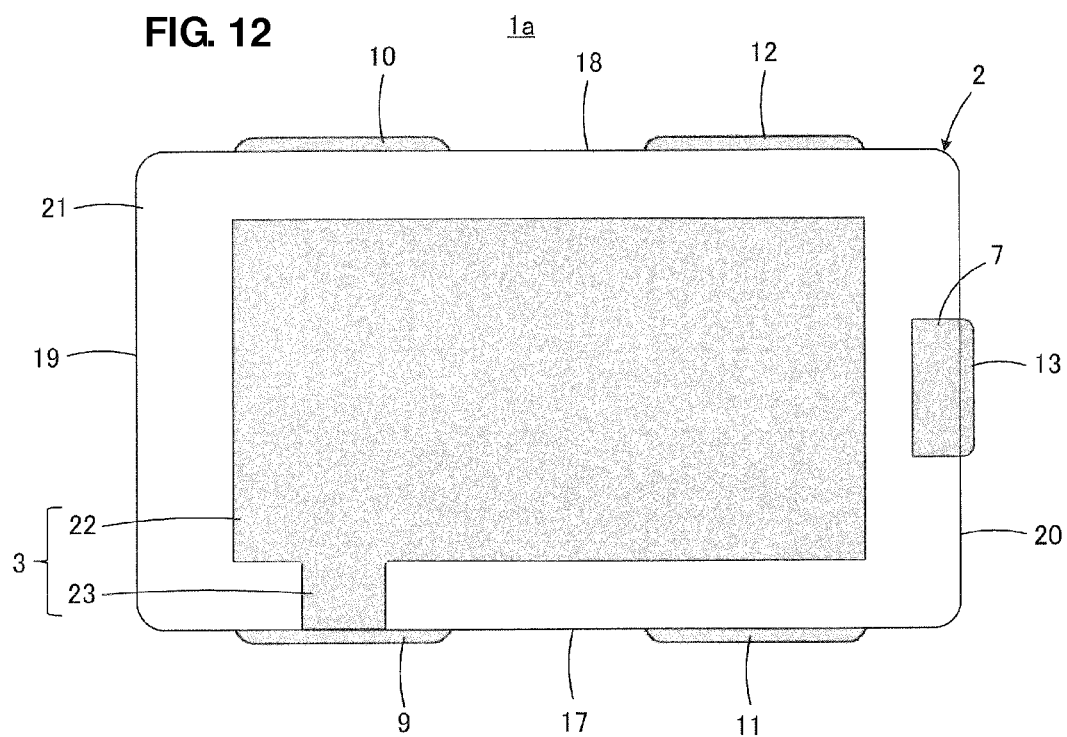
FIG. 12 is a cut portion end view taken along a plane parallel to a main surface of a ceramic element body, in a laminated ceramic capacitor serving as a laminated ceramic electronic component according to a second preferred embodiment of the present invention, and illustrates a plane in which a first internal electrode extends.
Figure 13:
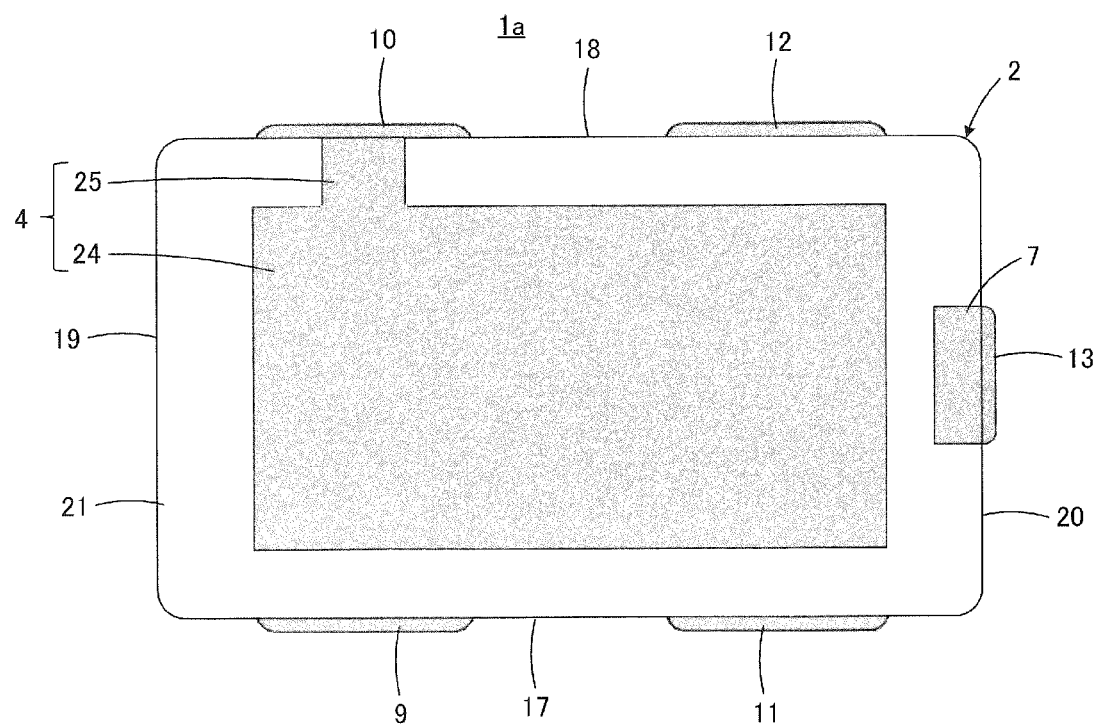
FIG. 13 is a cut portion end view taken along a plane parallel to the main surface of the ceramic element body, in the laminated ceramic capacitor illustrated in FIG. 12, and illustrates a plane in which a second internal electrode extends.
Figure 14:
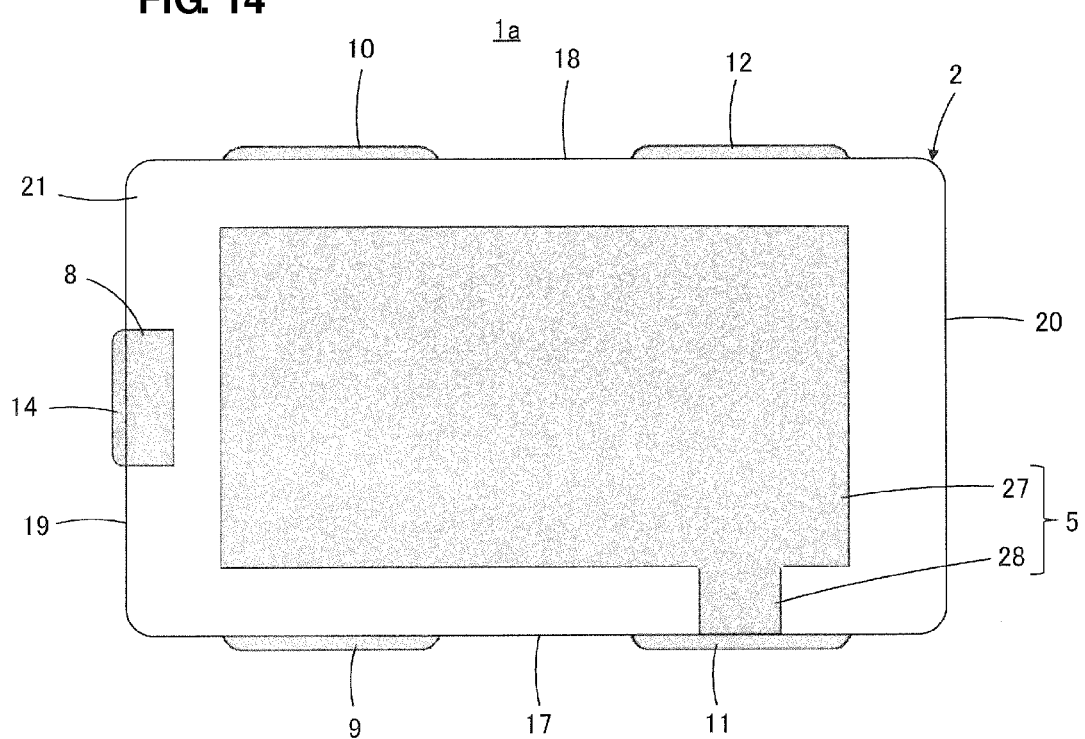
FIG. 14 is a cut portion end view taken along a plane parallel to the main surface of the ceramic element body, in the laminated ceramic capacitor illustrated in FIG. 12, and illustrates a plane in which a third internal electrode extends.
Figure 15:
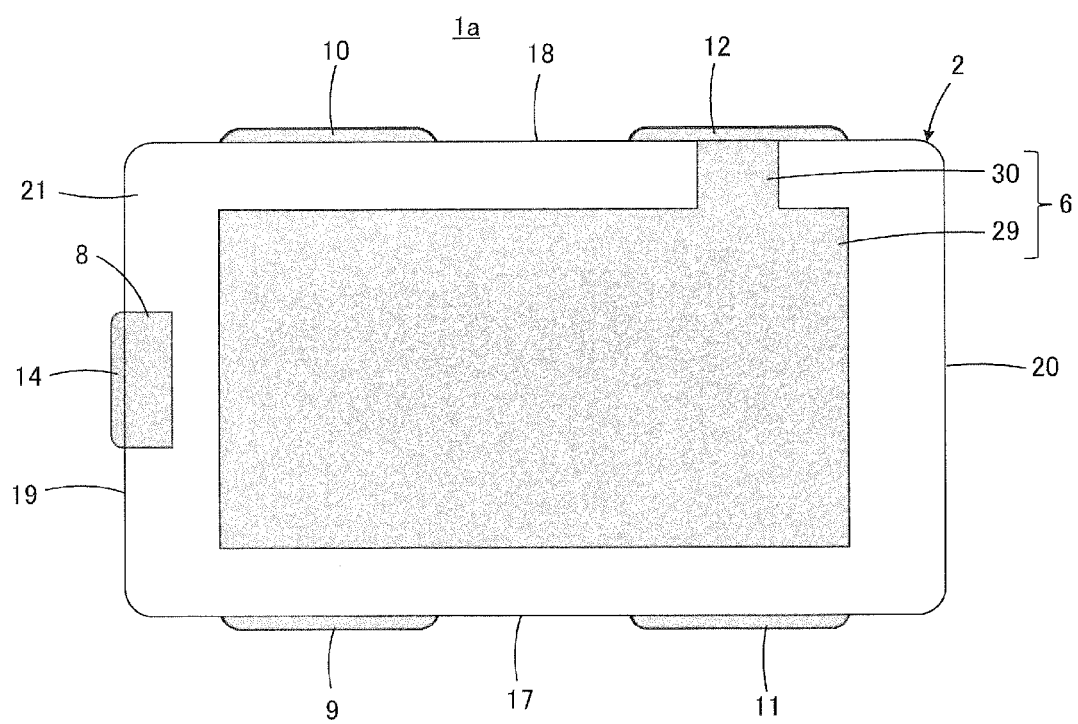
FIG. 15 is a cut portion end view taken along a plane parallel to the main surface of the ceramic element body, in the laminated ceramic capacitor illustrated in FIG. 12, and illustrates a plane in which a fourth internal electrode extends.

A second preferred embodiment of the present invention is illustrated in FIG. 12 to FIG. 15. FIG. 12 is a diagram corresponding to FIG. 7, FIG. 13 is a diagram corresponding to FIG. 8, FIG. 14 is a diagram corresponding to FIG. 9, and FIG. 15 is a diagram corresponding to FIG. 10. In FIG. 12 to FIG. 15, same reference symbols are assigned to elements corresponding to elements illustrated in FIG. 7 to FIG. 10, and the redundant description will be omitted.

In a laminated ceramic capacitor 1a according to the second preferred embodiment, the first marking internal conductor 7 is not only located on the same plane as the first internal electrode 3 illustrated in FIG. 12 but also located on the same plane as the second internal electrode 4, as illustrated in FIG. 13.

In addition, the second marking internal conductor 8 is also not only located on the same plane as the fourth internal electrode 6 illustrated in FIG. 15 but also located on the same plane as the third internal electrode 5, as illustrated in FIG. 14.

In this way, since the number of the marking internal conductors 7 and 8 increases and hence, in particular, the number of deposition points of plating increases in a phase where the marking external conductors 13 and 14 are formed owing to plating, it is possible to easily form the marking external conductors 13 and 14.

Third Preferred Embodiment

Figure 16:
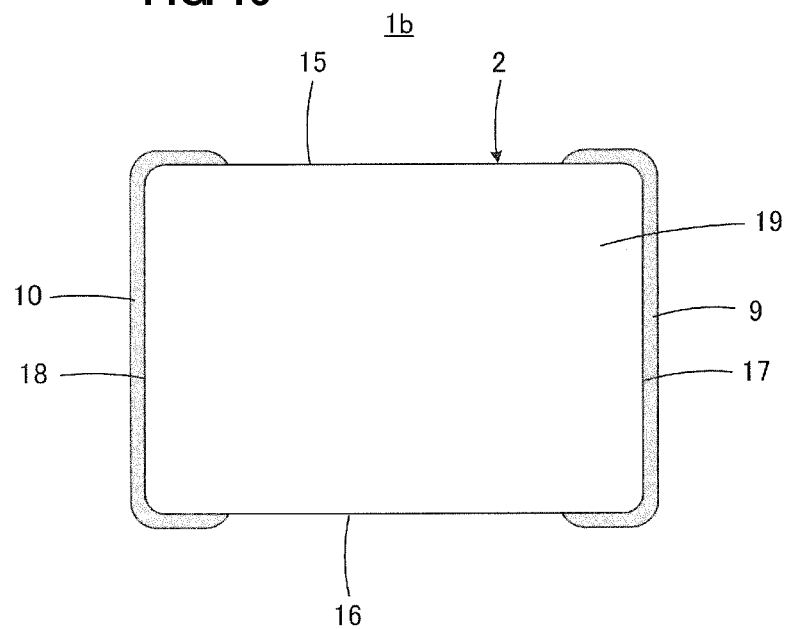
FIG. 16 is a right side view of a laminated ceramic capacitor serving as a laminated ceramic electronic component according to a third preferred embodiment of the present invention.
Figure 17:
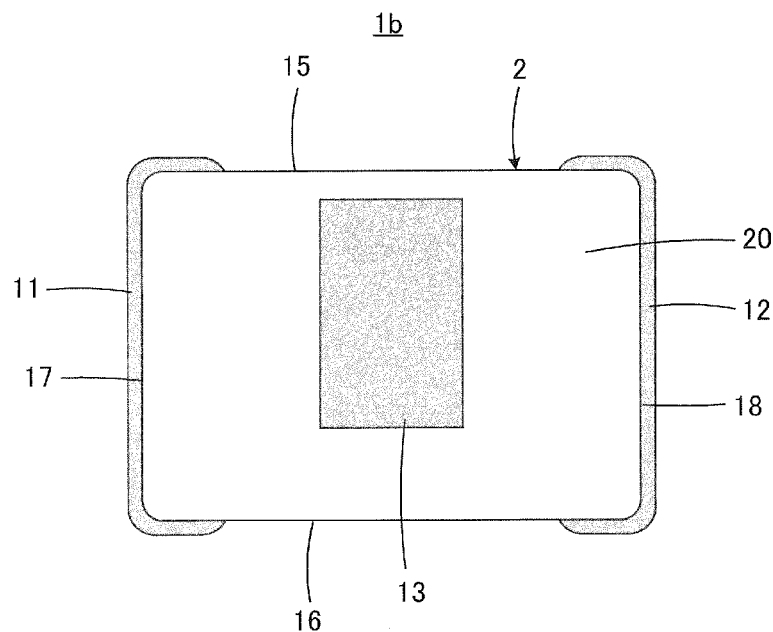
FIG. 17 is a left side view of the laminated ceramic capacitor illustrated in FIG. 16.
Figure 18:
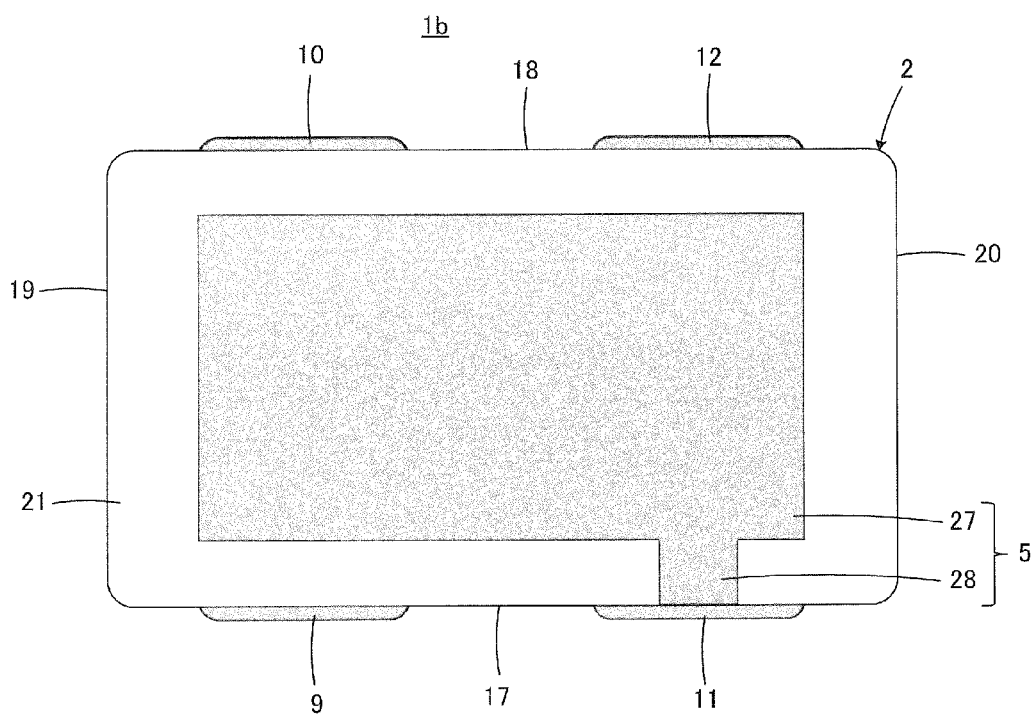
FIG. 18 is a cut portion end view taken along a plane parallel to main surfaces of a ceramic element body, in the laminated ceramic capacitor illustrated in FIG. 16, and illustrates a plane in which a third internal electrode extends.
Figure 19:
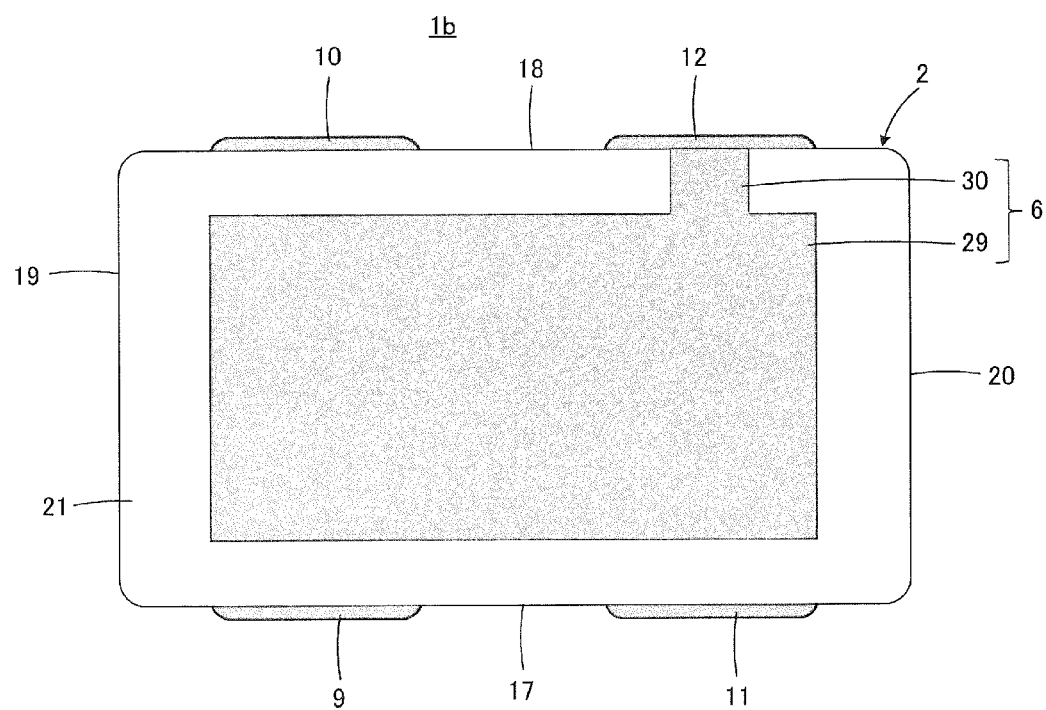
FIG. 19 is a cut portion end view taken along a plane parallel to the main surfaces of the ceramic element body, in the laminated ceramic capacitor illustrated in FIG. 16, and illustrates a plane in which a fourth internal electrode extends.

A third preferred embodiment of the present invention is illustrated in FIG. 16 to FIG. 19. FIG. 16 is a diagram corresponding to FIG. 3, FIG. 17 is a diagram corresponding to FIG. 4, FIG. 18 is a diagram corresponding to FIG. 9, and FIG. 19 is a diagram corresponding to FIG. 10. In FIG. 16 to FIG. 19, same reference symbols are assigned to elements corresponding to elements illustrated in FIG. 3, FIG. 4, FIG. 9, or FIG. 10, and the redundant description will be omitted.

In a laminated ceramic capacitor 1b in the third preferred embodiment, as will be appreciated from FIG. 18 and FIG. 19, no second marking internal conductor is included. In response to this, in the present preferred embodiment, as illustrated in FIG. 17, while the first marking external conductor 13 is formed, no second marking external conductor is formed, as will be appreciated from FIG. 16.

In the case of the present preferred embodiment, directionality is not selected on the basis of the length of the marking external conductor but on the basis of the presence or absence of the marking external conductor.

Fourth Preferred Embodiment

Figure 20:
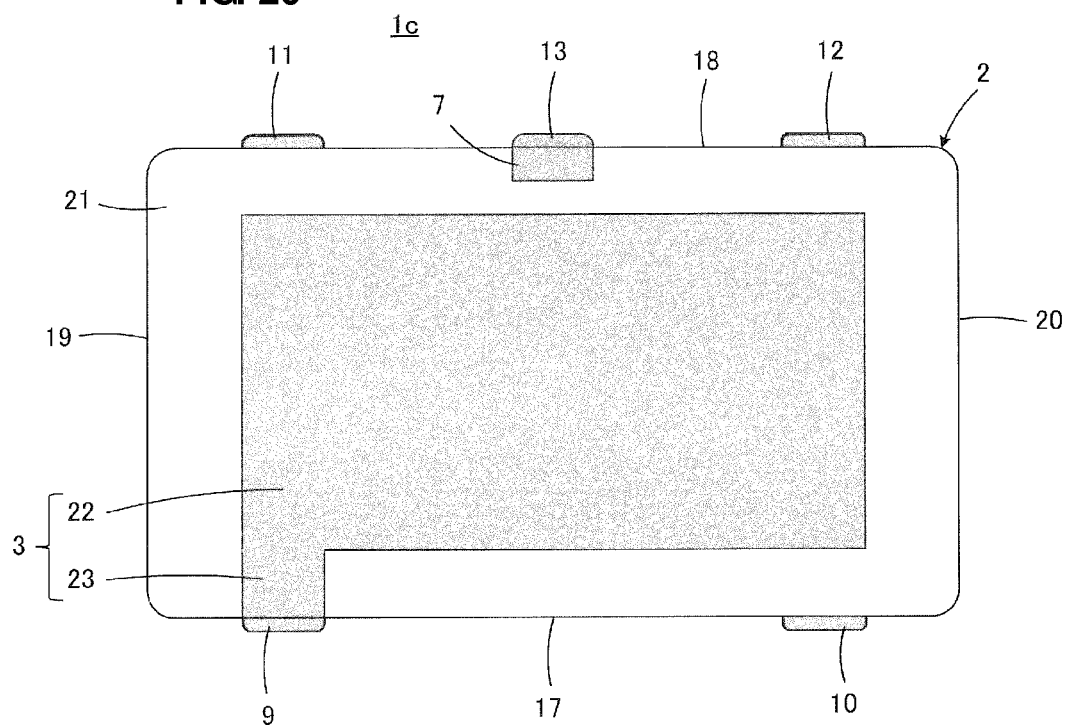
FIG. 20 is a cut portion end view taken along a plane parallel to main surfaces of a ceramic element body, in a laminated ceramic capacitor serving as a laminated ceramic electronic component according to a fourth preferred embodiment of the present invention, and illustrates a plane in which a first internal electrode extends.
Figure 21:
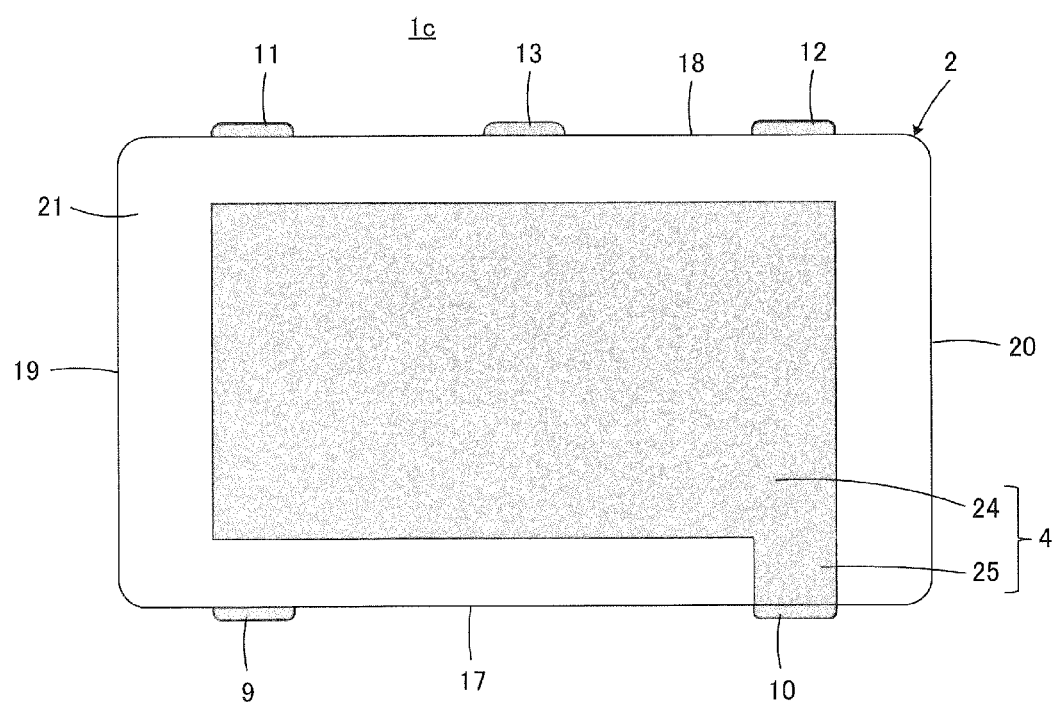
FIG. 21 is a cut portion end view taken along a plane parallel to the main surfaces of the ceramic element body, in the laminated ceramic capacitor illustrated in FIG. 20, and illustrates a plane in which a second internal electrode extends.
Figure 22:
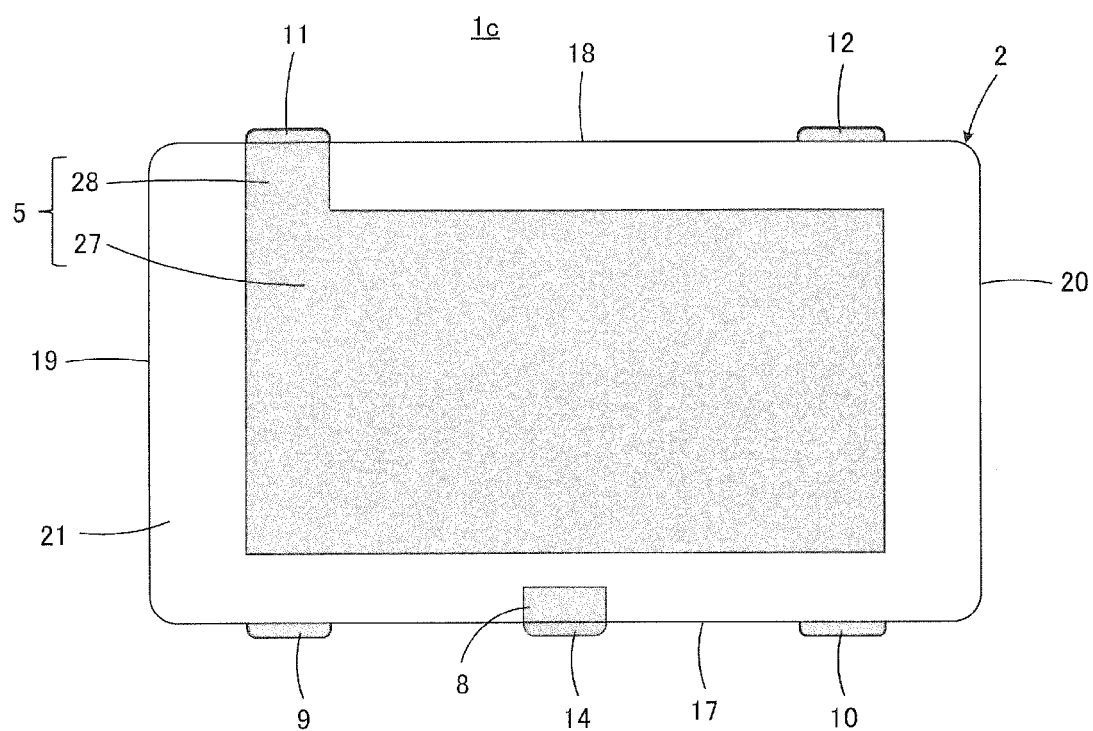
FIG. 22 is a cut portion end view taken along a plane parallel to the main surfaces of the ceramic element body, in the laminated ceramic capacitor illustrated in FIG. 20, and illustrates a plane in which a third internal electrode extends.
Figure 23:
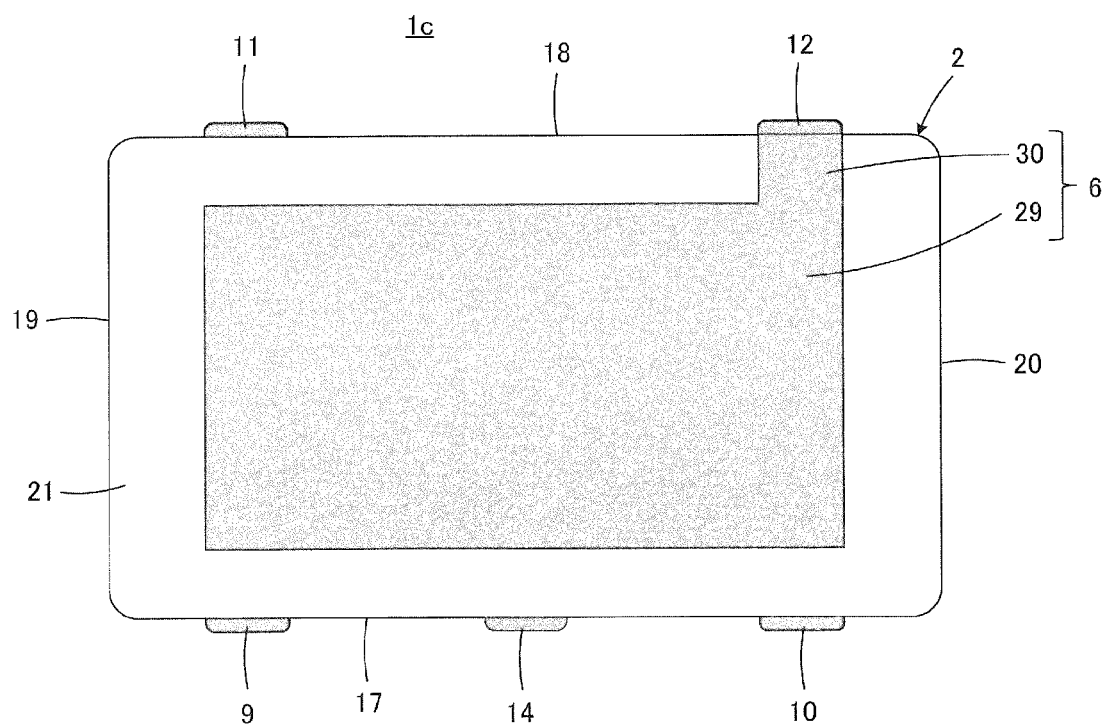
FIG. 23 is a cut portion end view taken along a plane parallel to the main surfaces of the ceramic element body, in the laminated ceramic capacitor illustrated in FIG. 20, and illustrates a plane in which a fourth internal electrode extends.

A fourth preferred embodiment of the present invention is illustrated in FIG. 20 to FIG. 23. FIG. 20 is a diagram corresponding to FIG. 7, FIG. 21 is a diagram corresponding to FIG. 8, FIG. 22 is a diagram corresponding to FIG. 9, and FIG. 23 is a diagram corresponding to FIG. 10. In FIG. 20 to FIG. 23, same reference symbols are assigned to elements corresponding to elements illustrated in FIG. 7 to FIG. 10, and the redundant description will be omitted.

Compared with the first preferred embodiment, as illustrated in FIG. 21, a laminated ceramic capacitor 1c according to the fourth preferred embodiment is different in that the second internal electrode 4 is extracted to the first side surface 17 and as illustrated in FIG. 23, the fourth internal electrode 6 is extracted to the second side surface 18.

In addition, as illustrated in FIG. 20, the first marking internal conductor 7 is exposed at the second side surface 18. Accordingly, as illustrated in FIG. 20 and FIG. 21, the first marking external conductor 13 is located on the second side surface 18.

On the other hand, as illustrated in FIG. 22, the second marking internal conductor 8 is exposed at the first side surface 17. Accordingly, as illustrated in FIG. 22 and FIG. 23, the second marking external conductor 14 is located on the first side surface 17.

Preferred embodiments of the present invention are not limited to the above-mentioned laminated ceramic capacitor, and may also be applied to another laminated ceramic electronic component. For example, when the ceramic element body is made of a piezoelectric body ceramic, a laminated ceramic electronic component functioning as a piezoelectric component may be obtained. When the ceramic element body is made of a semiconductor ceramic such as substantially spinel-like ceramic or other suitable material, a laminated ceramic electronic component functioning as a thermistor may be obtained. When the ceramic element body is made of a magnetic ceramic such as ferrite or other suitable material, a laminated ceramic electronic component functioning as an inductor may be obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A laminated ceramic electronic component comprising:
    a ceramic element body including a plurality of laminated ceramic layers and exterior surfaces including a pair of main surfaces facing each other, and a side surface connecting the pair of main surfaces;
    first, second, third and fourth internal electrodes disposed within the ceramic element body; and
    first, second, third and fourth external electrodes disposed on the side surface of the ceramic element body and electrically connected to the first, second, third and fourth internal electrodes, respectively; wherein
    within the ceramic element body, a first functional portion and a second functional portion are disposed so as to be adjacent to each other along a height direction in which the main surfaces are connected;
    in the first functional portion, the first and second internal electrodes face each other in the height direction through the ceramic layer;
    in the second functional portion, the third and fourth internal electrodes face each other in the height direction through the ceramic layer;
    the laminated ceramic electronic component further includes:
        a first marking internal conductor disposed on a same plane as at least one of the first and second internal electrodes and exposed at the side surface;
        a first marking external conductor disposed on the side surface so as to link a plurality of the exposed first marking internal conductors;
        a second marking internal conductor disposed on a same plane as at least one of the third and fourth internal electrodes and exposed at the side surface; and
        a second marking external conductor disposed on the side surface so as to link a plurality of the exposed second marking internal conductors;
    a total number of laminated layers of the first and second internal electrodes in the first functional portion is larger than a total number of laminated layers of the third and fourth internal electrodes in the second functional portion;
    a capacitance of the first functional portion is greater than a capacitance of the second functional portion; and
    the first and second marking external conductors are each disposed on and extend along one of the exterior surfaces of ceramic element body such that each of the first and second marking external conductors extends outwardly from the one of the exterior surfaces of the ceramic element body.

2. The laminated ceramic electronic component according to claim 1, wherein
a dimension of the first marking external conductor along the height direction is greater than a dimension of the second marking external conductor along the height direction.

\* \* \* \* \*